(12) United States Patent
Keigler (10) Patent No.: US 6,540,899 B2
(45) Date of Patent: Apr. 1, 2003

(54) METHOD OF AND APPARATUS FOR FLUID SEALING, WHILE ELECTRICALLY CONTACTING, WET-PROCESSED WORKPIECES

(75) Inventor: Arthur Keigler, Wellesley, MA (US)

(73) Assignee: All Wet Technologies, Inc., Wellesley, MA (US)

( * ) Notice: Subject to any disclaimer, the term of this patent is extended or adjusted under 35 U.S.C. 154(b) by 42 days.

(21) Appl. No.: 09/827,084

(22) Filed: Apr. 5, 2001

(65) Prior Publication Data

US 2002/0144900 A1 Oct. 10, 2002

(51) Int. Cl.[7] .......................... C25D 5/02; C25D 17/00; C25D 17/04
(52) U.S. Cl. .................. 205/118; 205/123; 204/224 R; 204/297.1; 204/297.05; 204/297.14
(58) Field of Search .......................... 205/80, 118, 123, 205/126; 204/297.14, 297.1, 297.05

(56) References Cited

U.S. PATENT DOCUMENTS

| | | | | | |
|---|---|---|---|---|---|
| 5,227,041 | A | * | 7/1993 | Brogden et al. | ........ 204/297.05 |
| 6,217,734 | B1 | * | 4/2001 | Uzoh | .................... 204/297.05 |
| 6,251,236 | B1 | * | 6/2001 | Stevens | .................. 204/279 X |

* cited by examiner

Primary Examiner—Donald R. Valentine
(74) Attorney, Agent, or Firm—Rines and Rines (57) ABSTRACT

A method and apparatus for fluid sealing the underside of a workpiece, such as a semiconductor wafer and the like, during wet-processing such as electrodeposition and the like, employing an elastomeric encased ring of flexible fingers against which the periphery of the workpiece underside is forced to deflect the fingers downwardly and engage a peripheral sealing bead against the underside periphery of the workpiece; and where electrical contact with the workpiece is desired, resiliently engaging electrical contact tips protruding through peripheral openings in the elastomeric covering within the sealing ring, with the underside periphery of the workpiece.

11 Claims, 6 Drawing Sheets

METHOD OF AND APPARATUS FOR FLUID SEALING, WHILE ELECTRICALLY CONTACTING, WET-PROCESSED WORKPIECES

FIELD OF THE INVENTION

The present invention relates generally to workpiece wet processing, such as electrodeposition, electro-etching, and electroless deposition and the like; being particularly, though not exclusively, concerned with electrodeposition onto substantially planar thin workpieces, such as silicon wafers and the like, and in a manner suitable for high-volume manufacturing. Specifically, the invention is directed to apparatus for reproducibly making a fluid seal to the outer perimeter of a face of such a workpiece, and in a manner conducive for simultaneously making uniform electrical contact along the workpiece perimeter.

BACKGROUND OF THE INVENTION

Electroplating and electroless plating are two major forms of wet chemistry deposition that are used in manufacturing for the application of copper, gold, lead-tin, indium-tin, nickel-iron, nickel and other types of metals or alloys of metals to workpiece surfaces such as semiconductor wafers, printed circuit board substrates, thin-film heads, and flat panel displays and the like, requiring high precision wet chemistry-based deposition. An important requirement of machines used for producing thin deposited films on such workpieces is that they be capable of prohibiting contamination of the backside and edge of the workpiece with process solution or deposited metal. The most common and challenging of these deposition processes is electrodeposition, and, accordingly, the present discussion will center around such electrodeposition as an example, although the invention, as will later be made evident, may equally be used advantageously for electroless deposition, as well.

Making a reliable and uniform electrical contact to the edge of a workpiece and, at the same time sealing the edge against fluid invasion is a recognized and difficult problem in the art of high precision electrodeposition on workpieces such as semiconductor wafers and the like. During such electrodeposition, if the electrical contact to the workpiece is not uniform or if the contact has high resistance to current flow, the desired uniform deposited film may not be achieved. A variety of means for trying to solve this problem have accordingly been proposed in the prior art over the years and will now be briefly summarized.

In U.S. Pat. No. 5,227,041 to Brogden, for example, an apparatus is described wherein the fluid sealing ring, such as an o-ring, sits in a groove in a base member, wherein a mechanical force is applied by a cam mechanism to push the workpiece to be electroplated against the sealing ring. Additionally, a plurality of electrical contacts are positioned adjacent to the sealing ring to make contact with the workpiece. There are, however, many silicon wafer and other electrodeposition applications that have stringent requirements for the workpiece sealing apparatus to achieve both electrical contact and fluid seal with a very narrow, 2 to 3 millimeter region at the wafer edge. The use of a separate seal and frame and contact compliance means as proposed by Brogden, however, is difficult to fit into such a narrow region around a workpiece periphery. The present invention, on the other hand, provides a novel integrated seal having elastomer molded directly to the electrical contacts in a shape suitable for admirably achieving a reliable seal while compliantly supporting electrical contacts within such narrow peripheral regions.

Other conductive gaskets have also been proposed to form an electrically conducting fluid seal between the workpiece and the body of the workpiece-holding rack, as disclosed, for example, in U.S. Pat. No. 4,696,729 to Santini. Unfortunately, the electrically conductive gasket, however, is subject to deposition on the surface, requiring undescribed frequent system maintenance.

Another approach to the solution of the above-described problems is described in U.S. Pat. No. 5,807,469 to Crafts, disclosing a cathode contact device comprised of a flexible metal clad laminate. Photolithographic methods are therein used to define a continuous metal rim on a polyimide substrate such that the opening in the dielectric substrate defines the area to be electrodeposited; and the metal rim defined on the substrate is used to make electrical contact to the workpiece. A resilient sealing surface may also be incorporated on the laminate inside of the metal ring to improve the fluid seal to the workpiece. This cathode contact device works in cooperation with a horizontal plating cell and this requires support by the rim of the plating cell. The use of a continuous metal ring contact is also described, as another example, by Woodruff in U.S. Pat. No. 6,080,291, wherein a thick and substantially stiff metal ring is employed. Since, as is well-known, two planes theoretically touch at only three points, such a continuous metal ring acts as a rigid plane and will therefore tend to contact the workpiece at only a few points. In contrast, in accordance with the novel approach of the present invention, numerous flexible conductive fingers are incorporated that both provide mechanical support of the workpiece and are made flexible along a radius extending from the center of the workpiece, thereby being accommodating to irregularities in the workpiece perimeter and making a plurality of reliable contacts to said workpiece; one contact, indeed, at every 1 millimeter or so around the entire workpiece perimeter.

Additional proposals have been made for making the fluid seal to the workpiece by attaching a resilient ring of material to the electrical contacting and workpiece positioning ring. U.S. Pat. No. 6,080,291 to Woodruff, as an illustration, discloses a workpiece-sealed electrical contact wherein an annular seal member is mounted onto an annular contact ring, with the apparatus incorporated into a rotatable process tool head. An inherent trade-off is incorporated into this type of design. If the resilient sealing member is elastic enough to provide sufficient microscopic deformation of the fluid sealing member to mate with the microscopic surface the irregularities of the workpiece, then the sealing member is not mechanically stiff enough to provide sufficient force at the workpiece surface to cause the requisite deformation, and hence the resulting fluid seal is imperfect.

Still other means have been proposed for making a releasable fluid seal for a workpiece, as in, for example, U.S. Pat. No. 5,660,699 to Saito. This approach incorporates an o-ring between the workpiece and a clamping surface. For some applications, however, this means requires too much space both in front of and behind the workpiece. The present invention, on the other hand, is designed to make a fluid seal to the workpiece without such space requirements— enabling use, in practice, indeed, with less than 0.1" space in front of the workpiece or 0.5" behind the workpiece.

None of the above or other prior art approaches of this problem have thus been entirely satisfactory for the electrodeposition of thin circular semiconductor wafers and the like for which (as well as for other types of workpieces) the present invention has now provided a new and elegant solution.

OBJECTS OF THE INVENTION

It is a primary object of this invention, therefore, to provide a new and improved method of and apparatus for temporarily fluid-sealing a workpiece surface such that the edge and back of the workpiece remain dry during the workpiece processing.

It is a further object to effect during such sealing, also temporary electrical contact to the workpiece surface throughout desired regions of the workpiece, and preferably with uniform distribution of electrical current into the workpiece surface throughout such regions.

An additional object is to provide such a novel sealed electrical contact that is robust and can withstand many thousand workpiece electrodeposition cycles, and even in a high temperature process solution, such as electroless nickel at 93 degrees Centigrade—all without attention, repair or maintenance.

Other and further objects will be explained hereinafter and are more particularly delineated in the appended claims.

SUMMARY OF THE INVENTION

In summary, from one of its important aspects, the invention embraces a method of fluid sealing while electrically contacting the face of a workpiece at its perimeter for wet-processing, that comprises, providing an elastomer-covered ring inwardly terminating in an upwardly projecting peripheral elastomeric sealing bead and covering an assembly of inwardly extending flexible fingers each having an upwardly projecting terminal electrical contact and upon the elastomer-covered inner ends of which fingers the perimeter of the underside of the workpiece is to engage along the sealing bead during the wet processing of the workpiece; resting the underside of the workpiece within the ring and forcing the underside periphery of the workpiece against the sealing bead and the inner ends of the elastomer-covered finger assembly, with said inner ends flexibly deflecting downwardly and resiliently creating a fluid seal around the workpiece-underside periphery at the sealing bead; providing a ring of peripheral openings in the elastomeric covering of the fingers inward of the sealing bead and exposing the electrical contact tips of the fingers therethrough such that, during the downward deflecting of the fingers, therein contact tips make resilient and electrical contact with the underside periphery of the workpiece inward of the sealing bead. The discussion will use as an example a downwardly facing workpiece although the invention may be used in any orientation.

To achieve these objectives, the invention includes a plurality of narrow flexible fingers that form an assembly and are embedded in the elastomeric material; for example, 360 fingers may be used to seal and contact the perimeter of a 200 millimenter wafer. For applications where electrical contact to the workpiece is required, a small region of each flexible finger, the contact tip surface, may be exposed through the surface of the elastomer, with this small contact region preferably coated with a film of gold, platinum, palladium, or other low-resistence electrical contact metal. A sealing bead is defined in said elastomer during the molding over the flexible finger assembly, with such sealing bead positioned adjacent to the contact region, toward the workpiece center—preferably, in practice, less than 0.021" away from the contact region, as later more fully explained. In a typical application of the invention, force is applied between the backside of the workpiece and the flexible finger assembly so that the elastomeric sealing bead is compressed against the workpiece surface to create a temporary fluid seal, and the flexible contact tips are pressed against the workpiece surface to create a plurality of low resistance electrical contacts that form a virtually continuous path of current entry around the workpiece perimeter region. In particular, as the flexible fingers deform, they each slide a small amount radially along the workpiece surface which serves beneficially to break up any oxides or contamination on the workpiece surface and enables a very low contact resistance temporary connection to be achieved between the flexible fingers and the workpiece surface.

Preferred and best mode designs and details are later explained.

BRIEF DESCRIPTION OF THE DRAWINGS

The invention will now be explained in connection with the accompanying drawings, wherein.

DETAILED DESCRIPTION OF PREFERRED EMBODIMENT(S) OF THE INVENTION

Figure 1:
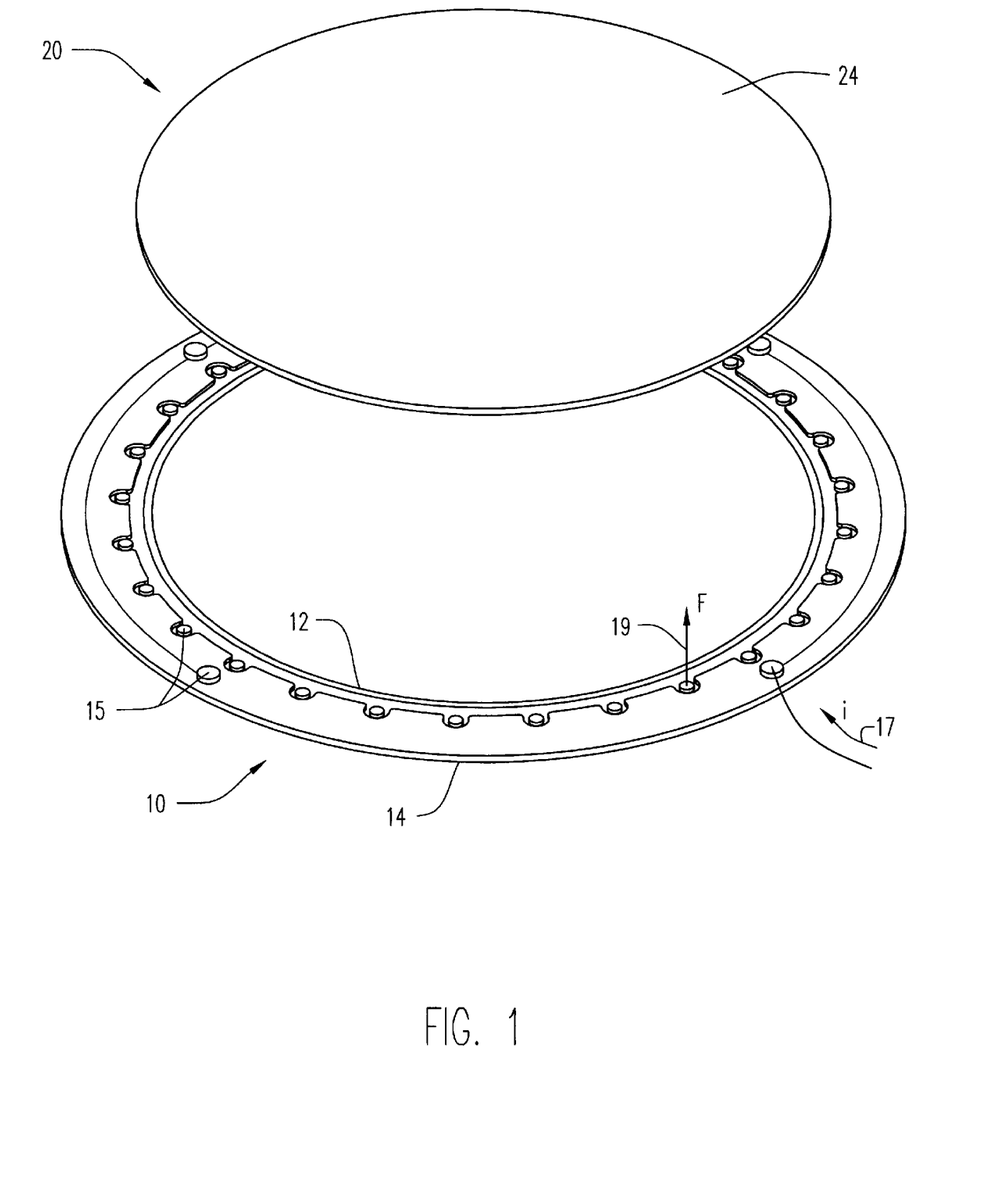
FIG. 1 is an isometric view of an illustrative sealing contact ring assembly and a workpiece.

Referring to FIG. 1, the invention, as applied to the before-mentioned illustrative and important field of electrodeposition of circular wafers and the like, comprises a sealing ring assembly 10 primarily comprised of a flexure assembly 12 that is molded into a sealing element 14. The sealing ring assembly 10 is configured completely to surround the wafer workpiece 20. Most commonly, both the workpiece 20 and the sealing ring assembly 10 will be of circular or rectangular shape. As earlier mentioned, a useful application of the invention is for processing semiconductor wafers, which are circular. That circular shape is illustratively shown in the drawings; it being noted, however, as before explained, that the invention is also applicable to rectangular workpieces such as printed circuit boards, package substrate panels, or flat panel displays or the like. One or more connection rods 15 are shown attached to the flexure assembly 12, providing a path through which electrical current, schematically illustrated by the flow line i at 17, can flow into the core ring in applications requiring electrical contact to the workpiece during the compliant fluid sealing of the workpiece. In some applications, the connection rods 15 may also be used to apply upward mechanical force to the sealing ring 10, indicated by the heavy arrow F at 19.

Figure 2:
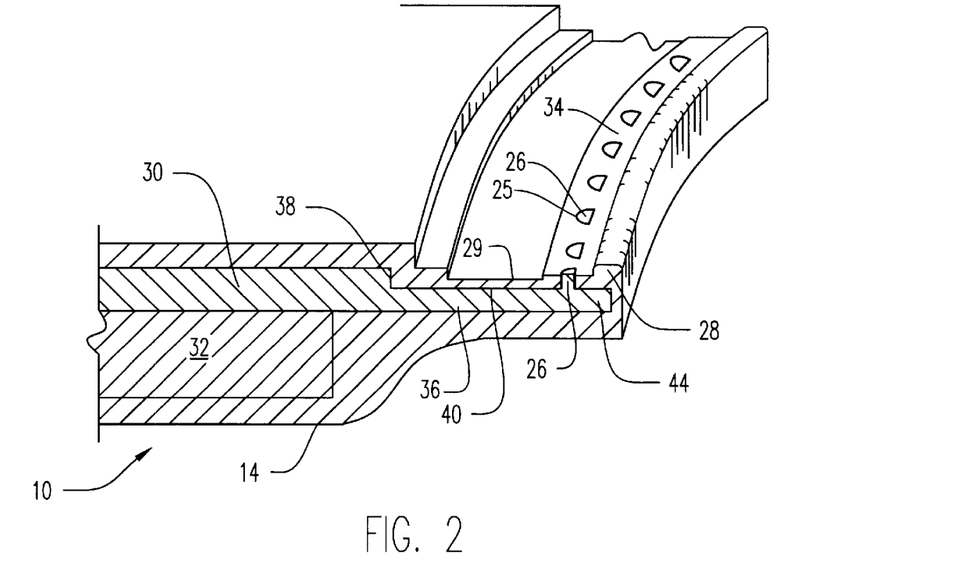
FIG. 2 is an isometric view of a cross section, upon an enlarged scale, of a sealed contact ring of the invention, showing the contact tips and the surrounding elastomeric sealing material.
Figure 3:
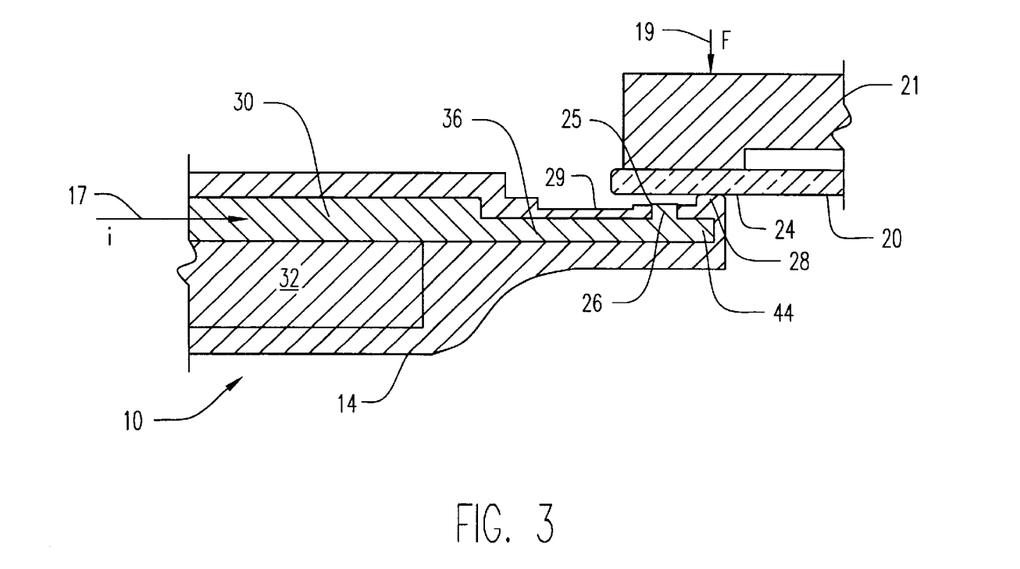
FIG. 3 is a cross section, again on an enlarged scale, of the sealed contact ring.
Figure 4:
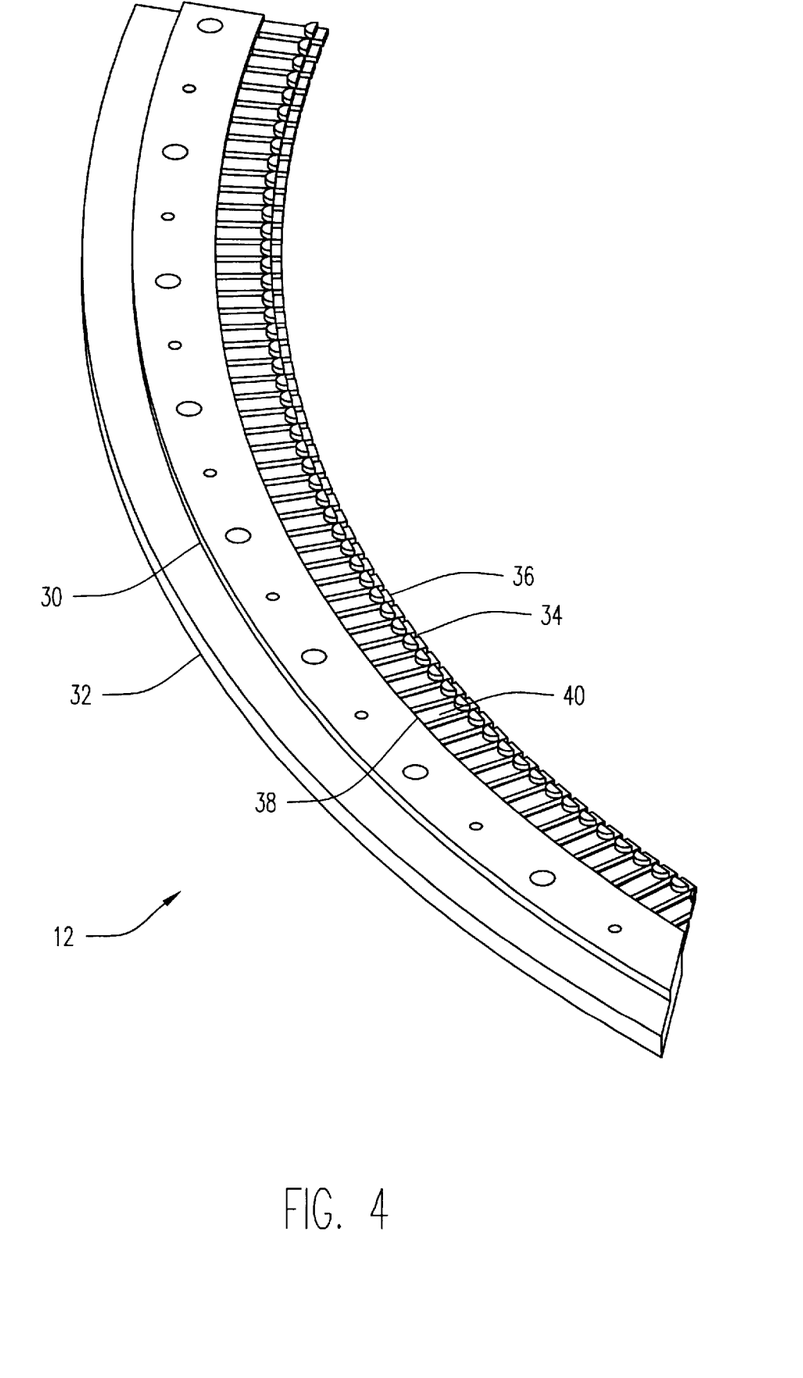
FIG. 4 shows an isometric view of the contact metal assembly portion.

Referring now to FIGS. 2, 3 and 4, the important features of the sealing ring assembly 10 near the workpiece perimeter 24 are illustrated. The flexure assembly 12 is advantageously constructed from two elements; a thin flexible flexure plate 30, and a thick and stiff support plate 32 therebelow. The flexure plate 30, for example, is preferably titanium or stainless steel between 0.010" and 0.030" thick. The support plate 32 is also preferably of titanium or stainless steel, but thicker, as between 0.1" and 0.25" thick. The support plate 32 may be positioned on the side of the flexure plate 30 facing the workpiece 20, as shown in the figures, or it may be positioned on the opposite side the flexure plate 30 from the workpiece 20. Suitable means, such as bolting, peening, or welding may be used for attaching the flexure plate 30 to the support plate 32 prior to molding the encasement 14 over the entire contact finger assembly. An upper backing plate 21, FIG. 3, enables the mechanical force F at 19 to be downwardly directed between the underside periphery of the workpiece 20 and the sealing ring 10 upon which the peripheral underside annular region 24 of the workpiece 20 rests. Details of the novel action resulting from the application of such mechanical force 19 between the underside workpiece perimeter 24 and the sealing ring 10 will later be discussed with particular reference to FIGS. 6A–C.

Figure 5:
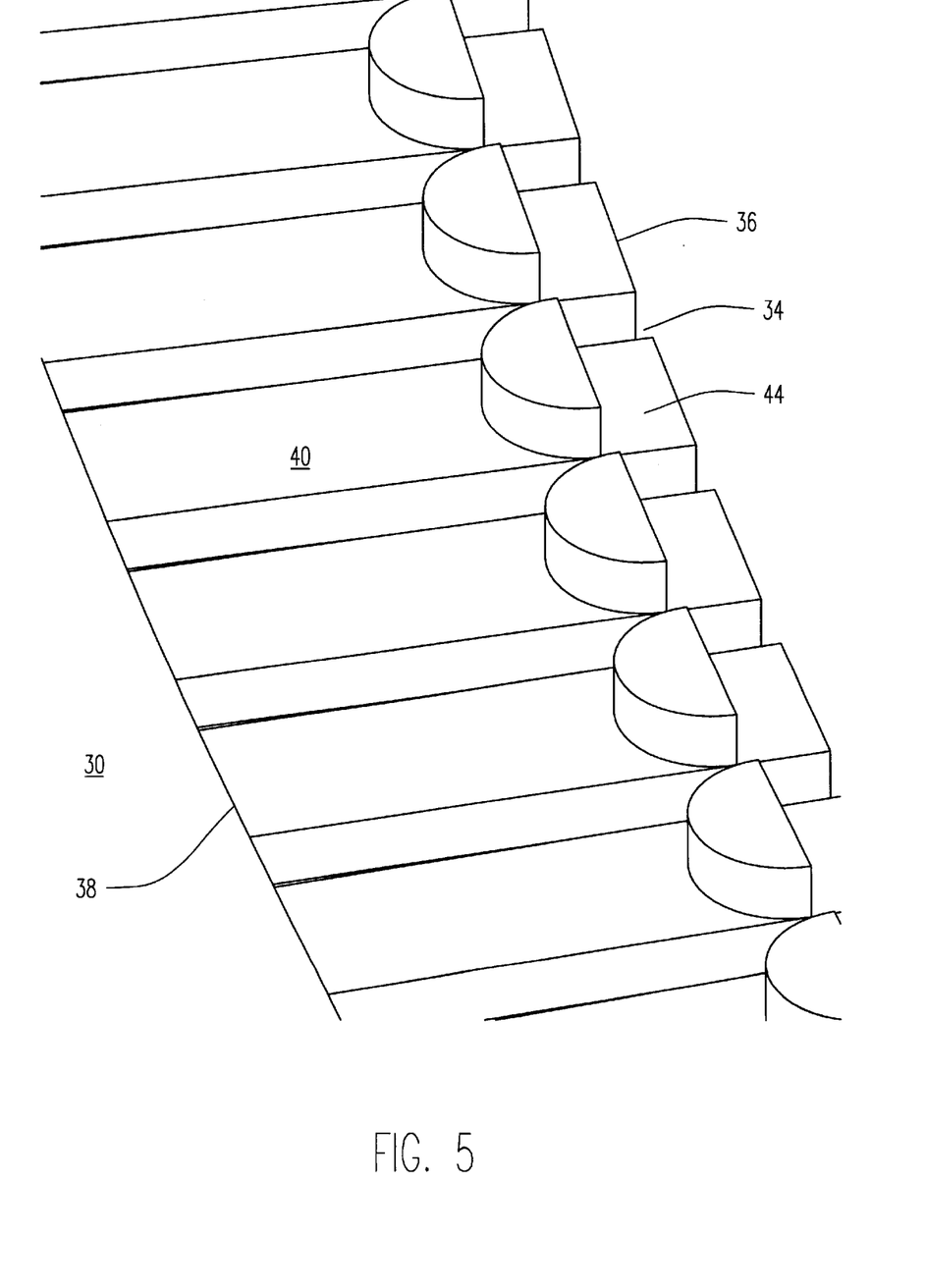
FIG. 5 illustrates a close-up isometric view of the contact tip region.

The plate 32 supporting the contact plate 30 is encased in a preferably elastomer molding 14, such as a fluorelastomer (for example, "Viton" manufactured by Dupont Corporation). As more clearly shown in FIG. 2, the inner (right-hand) peripheral region of the contact plate 30 is formed, commencing at region 38, with a plurality of radially extending flexure fingers 36 of reduced thickness (or recessed) at 40, each terminally carrying raised contact tips 26, shown as of circular quadrant shape in FIG. 5. The fingers 36 have gaps 34 therebetween, and their reduced thickness portions 40 serve as flexible thin beam sections, flexurally bendable from the main contact plate 30 at their bases at 38, as supported therebelow by the support plate 32, FIG. 2. The flexure of the fingers 36 will cause correspondingly deflecting of the terminal contact tips 26, with a supporting ledge 44 extending therebeyond.

In the encasement molding process, circumferentially formed openings 25 may be preserved in the regions where the circumferentially positioned projecting electrical contact tips 26, FIG. 2, are provided in the peripheral fingers 36 of the pressure plate 30, and are to be exposed for applications requiring electrical contact to the workpiece, as later more fully explained. Several important shapes are molded into the sealing element 14 such that their position and size with respect to the flexure assembly 12 is precisely controlled. An upwardly projecting peripheral sealing boss or bead 28, FIG. 2, is positioned adjacent to and outside the contact tips 26. A recess 29 in the molding is positioned inward of the contact tips for a purpose later explained. In applications not requiring electrical contact to the workpiece, however, the contact tip 26 and formed openings 25 may be omitted.

Figure 6A:
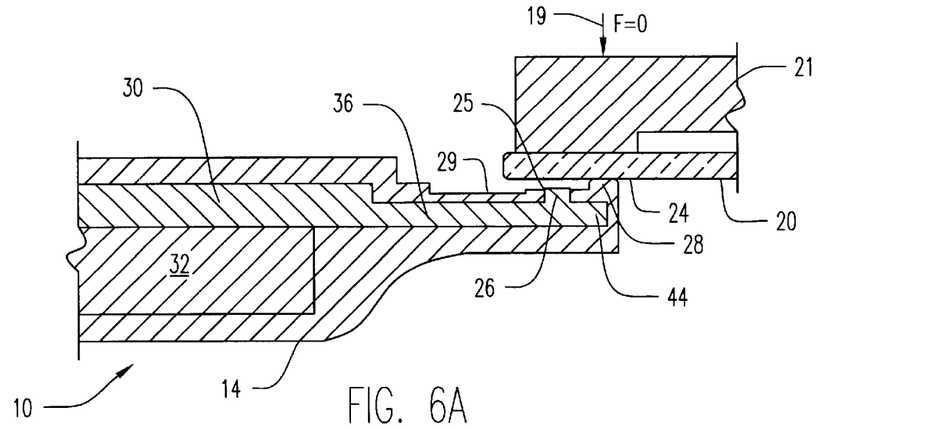
FIGS. 6A, 6B and 6C show cross sections of the novel sealing and contacting action of the invention in successive positions of sealing and contact operations.
Figure 6B:
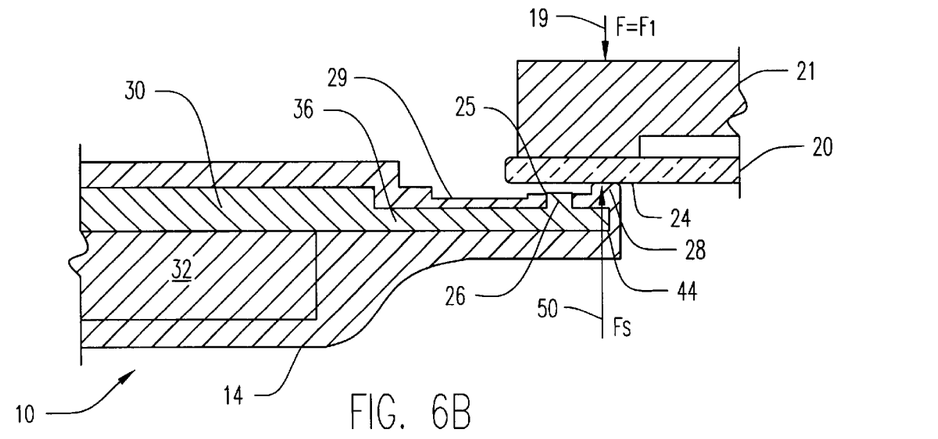
Figure 6C:
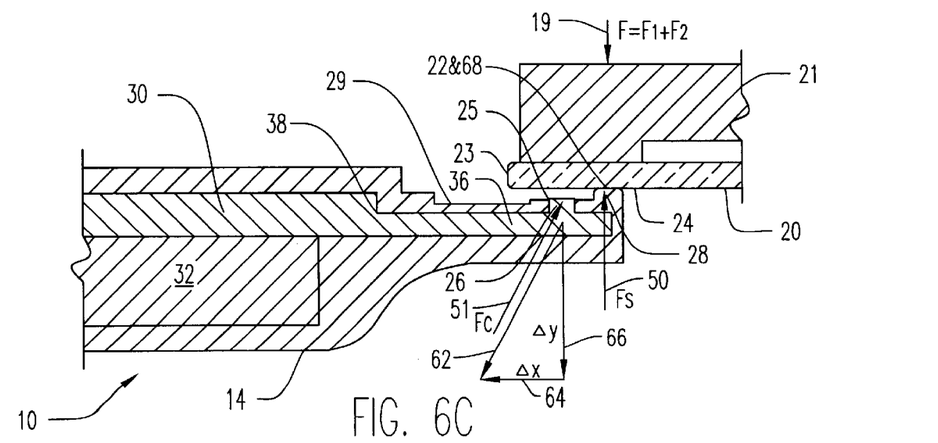

Referring to FIGS. 6A–C, the novel action of the apparatus of the invention may be understood. FIG. 6A shows a workpiece 20 resting within and making initial contact to the sealing ring 10, the workpiece underside perimeter 24 touching said ring at the upper surface of the sealing bead 28. The before-described force 19 is essentially zero (F=0) and the elements of the sealing ring 10 are not deformed. For purposes of this discussion, the sealing ring 10 will be considered fixed in space and the upper backing disk 21 will be forcibly pushed against said ring. The invention, however, may equally well be used in a manner where the backing disk 21 is held fixed and the sealing ring 10 is forcibly moved toward the backing disk; or some combination of these two movements may be used.

In FIG. 6B, the movement of the workpiece 20 toward the sealing ring 10 is shown, resulting from an increase in force 19 from zero to $F=F_1$. The sealing bead 28 now distorts and is compressed between the before-mentioned support ledge 44 at the end of each flexure finger 36 until the reaction force 50 (Fs) equals the applied force 19 (F). A particular advantage of the invention is that the dependability of the fluid seal formed at 60 between the workpiece underside perimeter 24 and the sealing bead 28, it is very good because the sealing bead 28 is locally resiliently supported by the flexible fingers 36. Although the elastomer 14 may be soft, enough sealing force 50 can be applied to the elastomer 14 to ensure that it fully distorts and fills microscopic valleys on the workpiece perimeter 24 through which fluid would otherwise leak. If the sealing bead 28 had not been so locally supported and it were made from soft elastic material, it would simply bend away from the workpiece surface and not incur the microscopic deformations required for a dependable fluid seal and attainable in accordance with the construction of the invention.

Referring now to FIG. 6C, the novel action of the structure of the invention for making a sealed resilient electrical contact to the workpiece may be understood in the showing of the exaggerated downward deflection of the fingers of the sealing ring 10. The applied force 19(F) is increased to $F_1$ plus $F_2$, causing the workpiece 20 to move into the sealing ring 10 until the deflection 62 of the flexure fingers 36 causes a reaction force Fc at 51 that, in combination with the elastomer deformation force 50 (Fs), is equal to the applied force F at 19. The deflection 62 is primarily a rotation around the root 38 of the flexure finger 36 and may be considered as the resilient deflection of a cantilever beam fixed at its base. The depth of the recess or thinned finger region 40 may be adjusted to provide an optimum flexure force 51 for a given deflection 62. A useful depth in practice is 0.01".

The before-mentioned recess 29 in the molded encasement adjacent to the contact surface 26 insures that, as the flexure finger 36 deflects at 62, the workpiece edge 23 does not contact the sealing element 14 and does not lift the workpiece 20 off of the metal contact surface 26. This rotational deflection 62 may be considered to have a horizontal component 64 and a vertical component 66. Of particular advantage for the purpose of making electrical contact to the workpiece 20 is the horizontal component of motion 64. Though this motion 64 is small, less than 0.001" in practice, it is large on the microscopic scale of surface atoms, and fortuitously causes a scraping or cleaning wiping action at the interface 68 between the contact finger tip 26 and the workpiece surface 22. This scraping action improves the conductivity of the electrical contact by causing a large shearing force (on a microscopic scale) at the surface 22, thereby breaking apart any dirt or oxides that may be present on either the workpiece surface 22 or the contact finger tip surface 26. Also of advantage for making a uniform electrical contact around the workpiece perimeter 24, is the fact that the vertical motion 66 may be different for each flexure finger 36 since each flexure finger 36 may move independently and thereby accommodate for deviations from planarity in both the workpiece surface 22 and the average position of all contact surfaces 26. The support plate 32 and flexure plate 30, moreover, are fabricated in a manner that positions all contact surfaces 26 substantially within a single plane. The applied force 19 is set to a level where the smallest deflection 62 among all flexure fingers 36 is well above the minimum required to establish a low resistance electrical contact. The capability of the flexure fingers 36 to adjust themselves to a non-flat workpiece surface 22 is also important for ensuring that the sealing bead 28 is compressed against the workpiece surface 22 around the entire workpiece perimeter 24 so that leakage does not occur when non-flat workpieces, are involved.

Figure 7A:
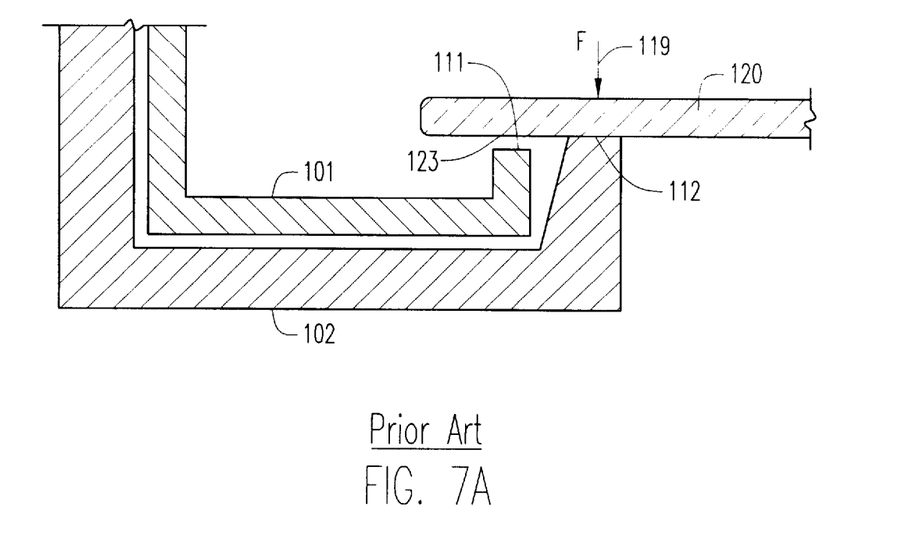
FIGS. 7A and B illustrate cross sections of prior art sealing and contacting action, contrasting from the operation of the invention as depicted in FIGS. 6A, B and C.
Figure 7B:
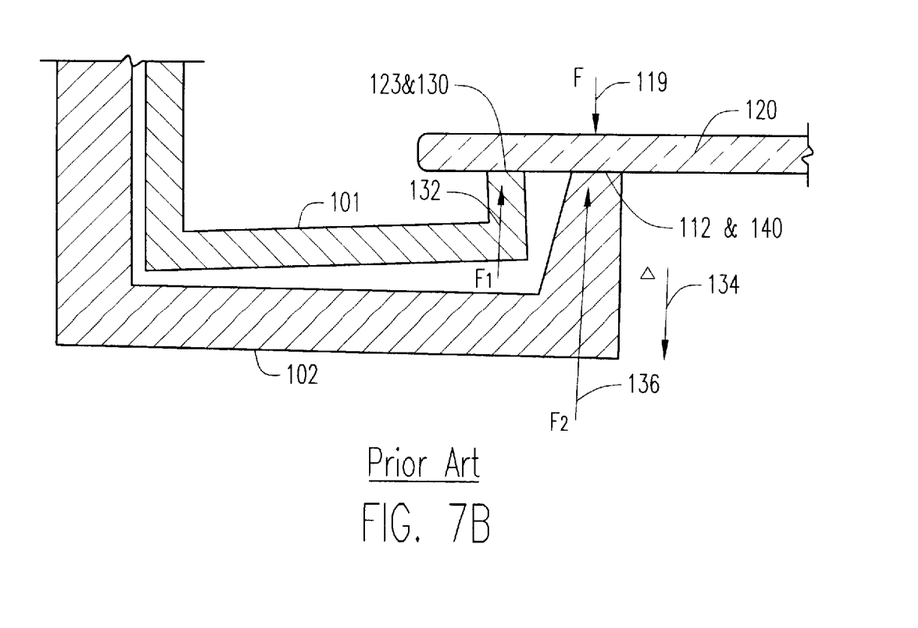

In order further to demonstrate the efficacy of the improvements of the present invention over the prior art for making a sealed electrical contact to a workpiece, FIGS. 7A and 7B are presented to illustrate the prior art uses of a rigid contact ring 101 and a resilient sealing ring 102 that are assembled together. FIG. 7A shows the workpiece 120 just contacting the resilient sealing ring 102 at a sealing surface 112, such that the applied force 119 is zero. A distinct improvement of the present invention over such prior art can be seen in the precision and repeatability of the relative positioning between the sealing surface 28 and the contact surface 26 by the intimate mating that results from the flexure finger assembly 12 of the invention being molded into the sealing element elastomer 14. Prior art depends on the alignment of two separate pieces; the contact metal ring 101, and the resilient sealing element 102. FIG. 7B shows how, as the applied force 119 is increased in the prior art, and the workpiece 120 is moved toward the contact ring 101 until the workpiece surface 123 contacts the ring surface 111, an electrical contact 130 is formed, causing a reaction force 132. Because the contact ring 101 is continuous rather than a plurality of flexure fingers, however, it can not deflect a significant distance unless the applied force 119 is very large, which would, of course, risk damage to the workpiece 120. The lack of horizontal movement at the contact interface 130 in such prior art operation, moreover, causes disadvantageously higher electrical contact resistance than the present invention. FIG. 7B shows the movement 134 of the resilient sealing ring 102 that creates a reaction force 136 due to deflection of said ring 102 to cause a fluid seal at the interface 112 between the resilient sealing ring 102 and the workpiece surface 123. A further disadvantage of this prior art operation is that if the material for the sealing ring 102 were made elastic enough to fill the microscopic valleys that are likely to occur in both the workpiece surface 123 and the sealing surface 112 at the sealing interface 140, it would not be sufficiently stiff to apply a deformation reaction force 134 large enough to cause the deformation on a microscale at the interface 140; hence, the sealing interface 140 is likely to allow fluid leakage. In the present invention, to the contrary, as shown in FIGS. 6A–C, the sealing surface 28 is comprised of a soft elastomer 14 and it is forced against the workpiece surface 23 by a deformation reaction force 50 that results primarily from compression of the elastomer 14 across a short distance.

As earlier explained, while the preferred usage of the invention is an connection with applications where both fluid sealing and electrical contact are to be simultaneously established with the workpieces, the fluid sealing features of the invention are also useful in applications where electrical contact is not required.

Further modifications will also occur to those skilled in this art, and such are accordingly considered to fall within the spirit and scope of the invention as defined in the appended claims.

What is claimed is:

1. A method of fluid sealing while electrically contacting the underside perimeter of wet-processed workpieces, that comprises, providing an elastomer-covered ring inwardly terminating in an upwardly projecting peripheral elastomeric sealing bead, and covering an assembly of inwardly extending flexible fingers each (having an upwardly projecting terminal electrical contact and upon the elastomer-covered inner ends of which fingers the perimeter of the underside of the workpiece is to engage along the sealing bead during the wet processing of the workpiece; resting the underside of the workpiece within the ring and forcing the underside periphery of the workpiece against the sealing bead and the inner ends of the elastomer-covered finger assembly, with said inner ends flexibly deflecting downward and resiliently creating a fluid seal around the workpiece-underside periphery at the sealing bead; providing a ring of peripheral openings in the elastomeric covering of the fingers inward of the sealing bead and exposing the electrical contact tips of the fingers therethrough such that, during the downward deflecting of the fingers, there contact tips make resilient electrical contact with the underside periphery of the workpiece inward of the sealing bead, and wherein during said downward deflecting, the contact tips resiliently wipe clean the underside periphery of the workpiece as electrical contact is established.

2. The method of claim 1 wherein the fingers deflect independently insuring a uniform electrical contact all-around periphery of the workpiece.

3. The method of claim 1 wherein the workpiece is a thin circular wafer, and the fingers of said assembly extend radially inwardly of the periphery thereof.

4. Apparatus for fluid sealing while electrically contacting the underside perimeter of wet-processed workpieces, having in combination an elastomer-covered ring inwardly terminating in an upwardly projecting peripheral elastomeric sealing bead and covering an assembly of inwardly extending flexible fingers each having an upwardly projecting terminal electrical contact tip and upon the elastomer-covered inner ends of which fingers the perimeter of the underside of a workpiece adapted to be engaged along the sealing bead during the wet processing of the workpiece; with the underside of the workpiece placed within the ring means for forcing the underside periphery of the workpiece against the sealing bead and the inner ends of the elastomer-covered assembly of fingers, with said inner ends flexibly deflecting downward and resiliently creating a fluid seal around the workpiece-underside periphery at the sealing bead; a ring of peripheral openings formed in the elastomeric covering of the fingers inward of the sealing bead and exposing the electrical contact chips of the fingers their through such that, during said downward deflecting of the fingers, there contact tips make recently and electrical contact with the underside periphery of the workpiece inward of the sealing bead.

5. The apparatus of claim 4 wherein during said downward deflecting, the contact tips resiliently wipe clean the underside periphery of the workpiece as electrical contact is established.

6. The apparatus of claim 4 wherein the fingers deflect independently insuring a uniform electrical contact all around the periphery of the workpiece.

7. The apparatus of claim 4 wherein the workpiece is a thin circular wafer and the fingers of said assembly extend radially inwardly of the periphery thereof.

8. The apparatus of claim 4 wherein the fingers extend radially from a thin flexible flexure plate backed by a thicker stiff support plate inwardly of the fingers, and molded integrally within the elastomeric covering.

9. The apparatus of claim 8 wherein the fingers are thinner than the flexure plate from which they radially extend.

10. A method of fluid sealing while electrically contacting at or near the perimeter of wet-processed workpieces, that comprises, providing an elastomer-covered ring inwardly terminating in a upwardly projecting peripheral elastomeric sealing bead, and covering an assembly of inwardly extending flexible fingers each having a projecting terminal electrical contact and upon the elastomer-covered inner ends of which fingers the perimeter of the workpiece is to engage along the sealing bead during the wet processing of the workpiece; resting the workpiece within the ring and forcing the periphery of the workpiece against the sealing bead and the inner ends of the elastomer-covered finger assembly, with said inner ends flexibly deflecting and resiliently creating a fluid seal around the workpiece periphery at the sealing bead; providing a ring of peripheral openings in the elastomeric covering of the fingers inward of the sealing bead and exposing the electrical contact tips of the fingers therethrough such that, during the deflecting of the fingers, the contact tips make resilient electrical contact with the periphery of the workpiece inward of the sealing bead.

11. A method of fluid sealing while electrically contacting the underside perimeter of a wet processed workpiece in which an elastomer-covered ring is provided, inwardly terminating in an upwardly projecting peripheral elastomeric sealing bead covering an assembly of inwardly extending flexible fingers, each having an upwardly projecting terminal electrical contact; creating a resiliently fluid seal around the workpiece underside perimeter; and providing a ring of peripheral openings formed in the elastomer covering inward of the sealing bead.

* * * * *